US005952741A

United States Patent [19]

Toy

[11] Patent Number: 5,952,741

[45] Date of Patent: *Sep. 14, 1999

[54] EXTERNAL A/C ADAPTER PROTECTING USER AGAINST HAZARDOUS VOLTAGE

[75] Inventor: Samson K. K. Toy, Sunnyvale, Calif.

[73] Assignee: Cisco Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/116,671

[22] Filed: Jul. 16, 1998

[51] Int. Cl.[6] .................................................... H03K 17/56

[52] U.S. Cl. .......................... 307/326; 307/125; 307/126; 307/130; 307/139

[58] Field of Search .................................... 307/125, 126, 307/130, 139, 140, 326

[56] References Cited

U.S. PATENT DOCUMENTS

| | | | |
|---|---|---|---|
| 4,591,732 | 5/1986 | Neuenschwander | 307/140 |
| 4,704,599 | 11/1987 | Kimmel et al. | 340/333 |
| 4,835,737 | 5/1989 | Herrig et al. | 364/900 |
| 4,871,924 | 10/1989 | Sallati | 307/86 |
| 4,915,639 | 4/1990 | Cohn et al. | 439/188 |
| 4,995,017 | 2/1991 | Sellati et al. | 307/86 |
| 5,203,004 | 4/1993 | Bunton et al. | 395/800 |
| 5,293,636 | 3/1994 | Bunton et al. | 395/800 |

*Primary Examiner*—Jeffrey Gaffin
*Assistant Examiner*—E. Garlepp
*Attorney, Agent, or Firm*—D'Alessandro & Ritchie

[57] ABSTRACT

A safe external A/C adapter protecting the user against hazardous, high-voltage D/C output. High voltage is defined as any voltage in excess of 60V D/C. The adapter provides an internal remote ON/OFF circuit that automatically switches the D/C output OFF unless the output plug is seated within a mating socket disposed in an electronic device powered by the adapter. When the output plug is so seated, the hazardous voltage output is inaccessible to the user. In addition, a secondary shutdown circuit is provided that latches off the A/C input in the unlikely event that the remote ON/OFF circuit should fail. The secondary shutdown circuit is largely independent from the primary remote ON/OFF circuit, and can be implemented using control circuitry already present in the adapter. No special mechanical connectors are required. Also, because the D/C output is energized only upon insertion of the D/C output plug into the mating socket, and disabled when the output plug is removed, both the electronic device and the user are protected from electric arcing or sparking.

29 Claims, 1 Drawing Sheet

EXTERNAL A/C ADAPTER PROTECTING USER AGAINST HAZARDOUS VOLTAGE

BACKGROUND OF THE INVENTION

1. Field of the Invention

The present invention relates to the protection of users of electronic devices against potentially hazardous contact with high-voltage power supplies. More specifically, the present invention relates to a safe and inexpensive external A/C adapter with a high-voltage D/C output for use in small, low-cost power systems.

2. The Background

The dangers of electric shock from the careless use of common electronic appliances, from personal computers to musical christmas-tree lights, are well-known to those of ordinary skill in the art. A small current of only a few thousandths of an ampere across the heart of a human victim is enough to cause cardiac arrest and death in certain circumstances. Such electronic appliances and their associated power supplies have nevertheless become ubiquitous fixtures of modern life. The sheer familiarity of these devices, combined with the fact that power supplies are often quite small and innocuous in appearance, increase the likelihood that someone who is either unable to appreciate, or simply unaware of the threat—young children or infants, for example—will be exposed to dangerously high voltages, herein defined as any voltage exceeding 60V in absolute value relative to a ground reference.

For this reason, high-voltage power supplies are required to meet significant, and often costly, safety requirements well-known to those of ordinary skill in the art. One of these requirements is that any such safety system must be designed redundantly, so that no single failure is sufficient to compromise the safety system as a whole.

In consumer-electronics applications, the most common type of power supply is the external A/C adapter. These adapters are used in conjunction with electronic devices designed to operate under D/C power at specific voltages, and allow such electronic devices to be powered from standard A/C sources, like ordinary wall outlets. An external A/C adapter for use with such consumer-electronic devices usually comprises a small box unit, approximately six to twelve inches in length, with an A/C input designed to plug into a wall outlet or other source of A/C power (typically 110V A/C at 60 Hz or 220V A/C at 50 Hz), and a D/C output in the form of a cord terminating in an output plug having a ground connector and one or more powered connectors carrying D/C voltage. The connectors are often of a female type to prevent accidental shorting.

The electronic device being powered by the adapter has a corresponding mating socket which typically takes the form of a recessed area in the chassis of the device. Within the mating socket, a plurality of uninsulated metallic pins is disposed, each of which join, or mate, with a respective one of the female connectors of the D/C output plug when the plug is inserted into the device's mating socket.

Housed within the adapter unit is a conventional power supply (either linear or switched) which converts the A/C input from a standard A/C source to the desired D/C output voltage level(s). In addition, the adapter contains rectification and control circuitry that converts the potentially noisy, sinusoidally-varying A/C input into a clean, constant D/C output suitable for proper device operation. The D/C output is often coupled to the A/C input indirectly through inductive means such as a transformer. Keeping the D/C output and A/C input portions of the adapter separate enhances the safety of the device, and for this reason, it is important that any control circuitry used to communicate between the A/C and D/C portions of the adapter be implemented in a way that does not link them directly. For instance, optical, magnetic, or capacitive coupling may be used.

Since the A/C adapter is external to the device, it is possible for the D/C output plug to be energized when the output plug is not yet safely seated in the device mating socket, leaving the "hot" D/C output plug dangerously free and exposed. Normally, some mechanical means of protection, in the form of specially designed connectors with deeply recessed outputs, are used to block physical access to the high-voltage D/C output of the adapter. Such special connectors, however, are typically large, cumbersome, and expensive.

Moreover, such prior-art mechanical precautions are often deficient in another respect: because the D/C output plug remains "hot" regardless of whether or not it is inserted in the device input socket, a danger exists of electric arcing and sparking between the D/C output plug and the device mating socket whenever the plug is inserted or removed. This phenomenon not only jeopardizes user safety; it can also destroy the delicate circuitry of the electronic device that draws power from the adapter.

Accordingly, it is an object and advantage of the present invention to provide a safe external A/C adapter that protects the user from exposure to dangerously high voltages without the need for a special mechanical connector, using simple internal electronic control circuitry.

It is another object and advantage of the present invention to provide a safe external A/C adapter with a D/C output that turns ON only after the D/C output plug has been safely inserted into the device input socket.

Yet another object and advantage of the present invention is to provide a safe external A/C adapter with a D/C output plug that turns OFF prior to being completely removed from the device input socket.

Yet another object and advantage of the present invention is to provide a safe external A/C adapter with independent backup circuitry so that a single failure in the system will not compromise the user's safety.

These and many other objects and advantages of the present invention will become apparent to those of ordinary skill in the art from a consideration of the drawings and ensuing description of the invention.

BRIEF DESCRIPTION OF THE INVENTION

The present invention is a system and apparatus for safely delivering power from an external A/C adapter to an electrical appliance. The present invention relies on simple electronic, rather than mechanical, means to protect the user from exposure to dangerously high voltages. Because the invention does not require the use of special, cumbersome mechanical connectors, it offers all the advantages of light, compact, and inexpensive design.

The system of the present invention comprises an external A/C adapter and an electrical appliance including a mating socket for use with the adapter.

The adapter includes: an A/C input; power supply circuitry for converting the A/C input into a D/C output; a D/C output cord terminating in a plurality of powered connectors and at least one connector to a local ground; a Remote ON/OFF ("ROF") socket; a controlling circuit coupling the A/C input and D/C outputs through a first coupler; a safety switch linked to the D/C output; an actuator circuit linked to the ROF socket and the safety switch, capable of turning the switch ON when a triggering voltage measured relative to the local ground is applied to the ROF socket, and OFF otherwise; and a secondary shutdown circuit, linked directly to the ROF and the D/C output, and coupled to the controlling circuit through a second coupler, capable of latching off the A/C input should the first shutdown circuit fail.

The mating socket includes a plurality of pins, one for each of the plurality of D/C output connectors, and an ROF pin that shorts the ROF socket of the D/C output plug to a source of voltage equal to the triggering voltage required to turn the safety switch ON when the D/C output plug is safely seated within the mating socket.

The default condition of the D/C output of the adapter is OFF. It can only be turned ON when the correct triggering voltage is applied to the ROF socket, and this can only occur under normal operating conditions when the D/C output plug is safely seated in the mating socket disposed on the device and therefore inaccessible to the user. When the triggering voltage is applied to the ROF, the actuating means turns the safety switch ON and energizes the D/C output.

In the event that the first system should fail, for instance, if the safety switch becomes short-circuited, so that it remains ON even when the triggering voltage is not applied to the ROF socket, the secondary shutdown circuit latches the A/C input supply OFF through the controlling circuit.

BRIEF DESCRIPTION OF THE FIGURES

The FIGURE is a schematic diagram depicting a safe A/C adapter and a mating socket for use with the adapter in accordance with a presently preferred embodiment of the invention.

DETAILED DESCRIPTION OF THE INVENTION

Figure 1:
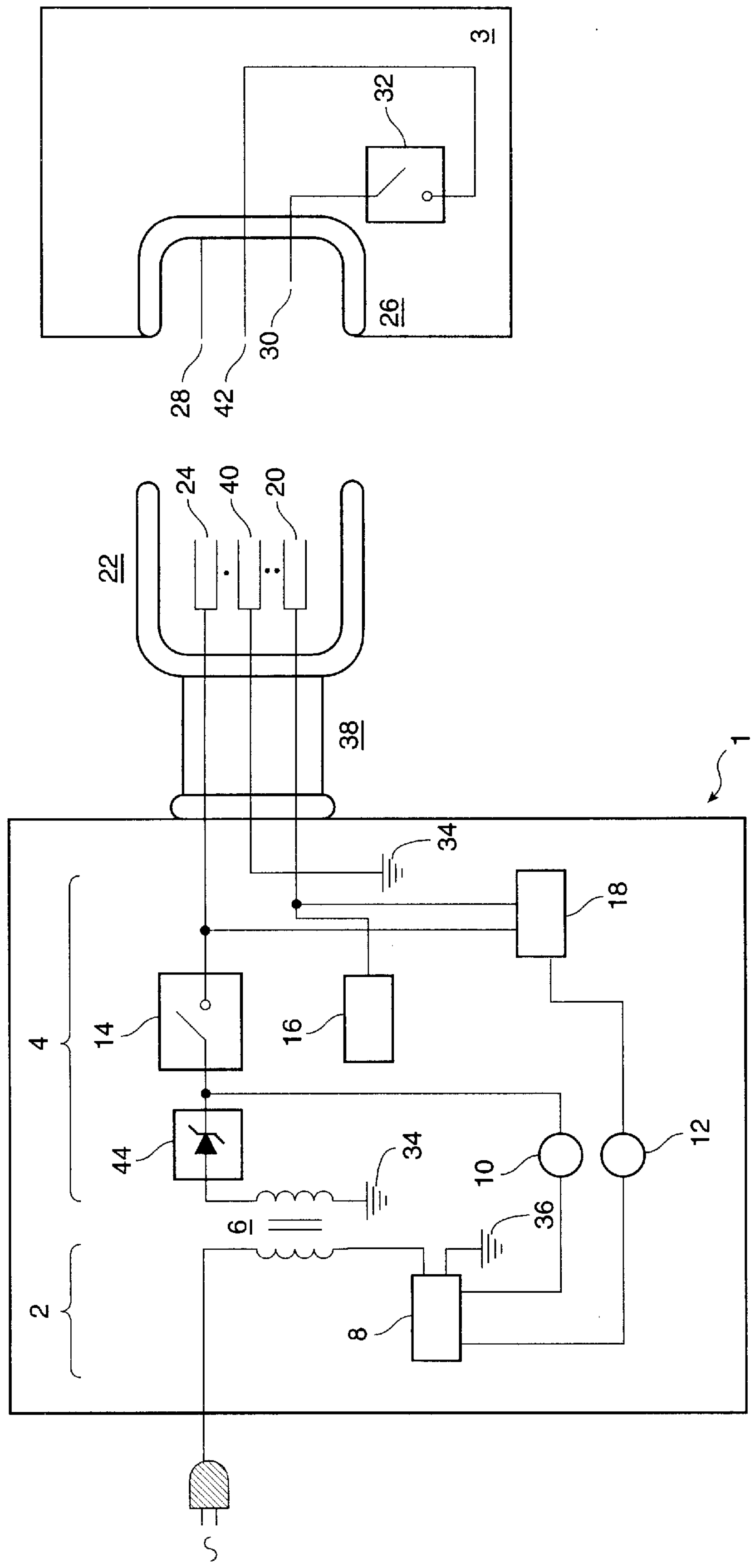

Those of ordinary skill in the art will realize that the following description of the present invention is illustrative only and is not intended to be in any way limiting. Other embodiments of the invention will readily suggest themselves to such skilled persons from an examination of the within disclosure.

In a presently preferred embodiment of the invention, depicted schematically in The FIGURE, the adapter 1 can be regarded as comprising two portions: an A/C input portion 2, and a D/C output portion 4, coupled to one another through an inductive means provided by a transformer 6. The A/C input 2 is feedback-controlled with a control circuit 8 that is indirectly coupled to the D/C output 4 with a first coupler 10. The sinusoidally varying A/C input voltage is converted into a D/C output with rectifying circuitry 44. The rectification circuitry 44 is represented in a highly schematic way to avoid overcomplicating the disclosure. As will be apparent to those of ordinary skill in the art, the precise choice of rectification circuitry 44 is a matter of design preference, and the inventive concepts of the present invention do not depend on the details of the rectification method.

The output of D/C output portion 4 is delivered to an electronic device 3 powered by the adapter 1 with an insulated cable 38 terminated by an output plug 22 having a plurality of powered connectors 24 and at least one grounded connector 40 linked to a safety ground 34. Only differences in voltage are meaningful, and the role of the ground 34 is to define a voltage reference local to the output of the adapter 1 (and the powered device 3). The voltage levels of the powered connectors 24 of the D/C output portion 4 are always understood to be in reference to the ground 34. As is well-known to those of ordinary skill in the art, the choice of ground 34 is essentially arbitrary, and the voltage of the ground 34 is defined to be 0V as a matter of convenience.

Because the ground 34 is local to the D/C output portion 4 of the adapter 1, and is, in particular, distinct from the ground 36 of the A/C portion 2 (the ground shared by the user), the coupler 10 should be implemented so that there is no direct conducting path between the A/C input 2 and D/C output 4 portions of the adapter 1. In a presently preferred embodiment of the invention, coupler 10 is an optical isolator, which consists of a light-emitting diode, or LED, and a photosensitive transistor that can be turned ON and OFF when exposed to light from the LED. Because the coupling is achieved using photons rather than electrons, there is no direct conducting path between the A/C and D/C portions 2, 4 of the adapter 1. Isolation of the D/C portion 4 from the A/C portion 2 enhances the safety of the adapter 1 by allowing the ground 34 of the D/C portion to "float" in relation to the A/C ground 36. As will be apparent to those of ordinary skill in the art, a variety of alternative coupling methods may also be used, including, but not limited to, magnetic or capacitive coupling with a transformer or a capacitor, respectively.

For safety reasons, in a presently preferred embodiment of the invention, the connectors 24 are female; that is, they are recessed and convex, and are thus relatively inaccessible to the user without the use of special implements or tools. Use of female connectors also decreases the probability of unwanted shorting between connectors. The number of connectors used in a presently preferred embodiment of the invention is 8, but this number is illustrative only and not intended to be in any way limiting. As will be apparent to those of ordinary skill in the art, the inventive concepts described herein can easily be extended to an adapter with a D/C output having any number of connectors.

A corresponding mating socket 26 is disposed on the powered electronic device 3 having a plurality of connectors 28, each complementary to, and capable of interlocking, or mating, with a respective one of the plurality of connectors 24. In a presently preferred embodiment of the invention, the connectors 28 are realized as uninsulated male pins. In addition, an ROF socket 20 and a corresponding ROF pin 30 are provided in the output plug 22 and the mating socket 26, respectively. The ROF pin 30 is electrically linked, through a mechanical switch 32, to a connector 42 in the mating socket 26 that mates with a grounded connector 40. When mated with the ROF pin 30, the ROF socket 20 is therefore shorted to ground 34. The mechanical switch 32 can be turned ON and OFF by the user, and is an extra safety feature and/or convenience that is not essential to the present invention. It is described here for purposes of illustration only. The ROF socket 20 could also be shorted to ground 34 directly when mated with the ROF pin 30, without the use of a switch 32.

The D/C output 4 can be switched ON or OFF with a switch 14. The switch 14 is linked to an actuating circuit 16 that is linked in turn to the ROF socket 20 disposed in the D/C output plug 22. The default state of the switch 14 is always OFF. Under normal operating conditions, the switch 14 can only be turned ON by the actuating circuit 16 when the ROF socket 20 is shorted to the ground 34. In a presently preferred embodiment of the invention, switch 14 is non-mechanical and implemented with high-voltage transistors.

The operation of the ROF can now be summarized. Again, the default state of the D/C output 4 of the adapter 1 is always OFF, and it can only be turned ON when the ROF socket 20 is shorted to the ground 34. Under normal operating conditions this can only occur when the D/C output plug 22 is seated in the mating socket 26 disposed on the device 3, and the ROF socket 20 is mated with the grounded ROF pin 30. The mating socket 26 and the D/C output plug 22 are designed so that when mated, the plurality of connectors 24 and 28 of the plug 22 and mating socket 26, respectively, are inaccessible to the user. When the output plug 22 is safely inserted into the mating socket 26, and the ROF socket 20 is shorted to the ground 34 through the ROF pin 30, the actuating circuit 16 turns the safety switch 14 ON, thereby energizing the D/C output 4. When the output plug 22 is removed, exposing the plurality of connectors 24, the ROF socket 20 is ungrounded, and the actuating circuit 16 turns the switch 14 OFF again, disabling the D/C output 4 and protecting the user from hazardous voltage.

As will be apparent to those of ordinary skill in the art, the use of a ground reference to trigger the actuating circuit 16 is not essential to the invention. Any safe (less than 60V relative to the local ground 34) voltage reference could also be used. Instead of using the ROF pin 30 to short the ROF socket 20 to the ground connector 40, one could just as easily use the ROF pin 30 to short the ROF socket 20 to any other low-voltage powered connector 24 of the output plug 22. The actuating circuit 16 would then be designed to turn switch 14 ON whenever the desired triggering voltage is applied to the ROF socket 20 and OFF otherwise.

Safety requirements well-known to those of ordinary skill in the art demand that any high-voltage safety system be designed redundantly so that no single failure is sufficient to compromise the safety system as a whole. While it might seem reasonable to meet this requirement simply by providing a duplicate backup system comprising another switch 14, and another actuating circuit 16, etc., such an approach would be unwise for at least two reasons. First, if the safety systems are in fact identical, then any condition that causes failure in one system is likely to cause failure in both. For instance, a transitory voltage spike that permanently shorts one switch 14 is likely to short both switches. Such duplication can also be inefficient from the point of view of expense, since it effectively doubles the number of safety components required. A presently preferred embodiment of the invention, however, overcomes both of these problems by providing a largely independent safety system that takes advantage of a component that already exists within the adapter: the control circuit 8.

The control circuit 8 controls the A/C input voltage as seen by the transformer 6. The control circuit 8 compensates for uncertainties in the A/C input and is used to maintain the voltage at D/C output 4 at a relatively constant level. In addition to its regulatory function, however, the control circuit 8 can also be used to completely latch off the A/C input 2, and thereby turn the D/C output 4 OFF.

In a presently preferred embodiment of the invention, the control circuit 8 is implemented as a pulse-width modulator linked to a high-voltage field-effect transistor, or FET. This particular control implementation is merely illustrative, however, and any number of alternative control implementations are possible that would naturally occur to those of ordinary skill in the art following a perusal of the present disclosure. The only relevant feature of the control circuit for the purposes of the present invention is that it is possible to use the control circuit 8 to latch-off the A/C input portion 2, shutting down the D/C portion 4 and protecting the user thereby.

A presently preferred embodiment of the invention therefore includes a secondary shutdown circuit 18 linked to the ROF socket 20 and the D/C output 4. The shutdown circuit 18 is also coupled to the control circuit 8 through a second coupler 12. Again, because the ground 34 is local to the D/C output portion 4 of the adapter 1, and is, in particular, distinct from the ground 36 of the A/C portion 2 (also shared by the user), the coupler 12 should be implemented so that there is no direct conducting path between the A/C input 2 and D/C output 4 portions of the adapter 1. In a presently preferred embodiment of the invention, coupler 12 is an optical isolator, but as will be apparent to those of ordinary skill in the art, a variety of alternative coupling methods may also be used, including, but not limited to, magnetic or capacitive coupling with a transformer or a capacitor, respectively.

If the shutdown circuit 18 senses that the switch 14 is ON but that the ROF socket 20 is not grounded, it communicates with the control circuit 8 through coupler 12 to latch off the A/C supply to the transformer 6 completely. This has the effect of shutting down the D/C output 4 without relying on switch 14, which is presumably malfunctioning and therefore unusable as a control element. Because the control circuit 8 is independent of switch 14, and is part of the adapter circuitry already, the secondary backup system thus provided is both safer and less expensive than mere duplication of the primary system.

The presently preferred embodiment of the invention is currently being used in a high-voltage adapter with three powered D/C outputs, at −71V, −24V, +5V, and a ground, used to supply power to a Mantis Router to be available from Cisco Systems, Inc. of San Jose, Calif. The −71V output is used to power a telephone ringer circuit. While only one of the powered outputs exceeds 60V, all but ground will shut down if the shutdown circuit is activated.

Unlike adapters that only provide user protection through mechanical means, the default state for the D/C output 14 is OFF, even when the adapter 1 is plugged into a source of A/C power. It remains OFF until the ROF socket 20 is grounded. Under normal operating conditions, this can only occur when the output plug 22 is seated securely in the mating socket 26 and the ROF socket 20 is mated with the ROF pin 30.

In a presently preferred embodiment of the invention, the ROF pin 30 is designed to be shorter than the other pins 28 disposed within the mating socket 26. Because of this, the ROF socket 20 mates with the ROF pin 30, turning the power supply ON, only after each of other output connectors 24 has made contact with its corresponding mate 28. Conversely, when the output plug 22 is removed, the ROF socket 24 and the ROF pin 30 are the first to disconnect, thus turning the power supply OFF 1 before the other power circuits are broken. Sparking and arcing between the power supply and the appliance are thereby avoided.

Alternative Embodiments

Although illustrative presently preferred embodiments and applications of this invention are shown and described herein, many variations and modifications are possible which remain within the concept, scope, and spirit of the invention, and these variations would become clear to those of skill in the art after perusal of this application. The invention, therefore, is not intended to be limited except in the spirit of the appended claims.

What is claimed is:

1. A system for providing high-voltage from an external A/C adapter to an electrical appliance, comprising:

an external A/C adapter including:

an A/C input;

power-supply circuitry for converting said A/C input into a D/C output of absolute voltage relative to a local ground of more than 60 Volts;

a D/C output cord in the form of an insulated cable terminated by an output plug having a plurality of connectors, wherein at least one of said plurality of connectors is linked to said local ground, for delivering said D/C output from said adapter to an electrical appliance;

a controlling circuit coupled to said D/C output through a first coupler, said circuit capable of regulating said D/C output by controlling said A/C input;

a safety switch linked to said D/C output, said switch capable of turning said D/C output on and off;

a Remote ON/OFF (ROF) socket disposed within said output plug;

an actuator circuit linked to said ROF socket and said safety switch, said actuator circuit capable of turning said safety switch ON when a triggering voltage of less than 60V relative to said local ground is applied to said ROF socket, and turning said safety switch OFF when a voltage other than said triggering voltage is applied to said ROF socket; and a secondary shutdown circuit, linked to said ROF socket and said D/C output and coupled to said controlling circuit through a second coupler, and capable of latching off said A/C input in the event that said triggering voltage is not applied to said ROF socket but said safety switch is nevertheless ON (for example, if said safety switch is shorted); and an electrical appliance including:

a mating socket having a plurality of connectors, each said connector complementary to, and capable of mating with, a respective one of said plurality of connectors of said output plug; and an ROF pin, capable of mating with said ROF socket, and shorting said ROF socket to a source of voltage equal to said triggering voltage when said output plug is seated within said mating socket.

2. The system of claim 1, wherein said ROF pin is recessed in relation to the other connectors in said mating socket, ensuring that when said output plug is inserted into said mating socket, said ROF pin is the last of said plurality of connectors in said mating socket to mate, and conversely, when said output plug is removed, said ROF pin is the first of said plurality of connectors in said mating socket to become disconnected.

3. The system of claim 1, wherein said source of voltage equal to said triggering voltage is one of said plurality of connectors of said D/C output cord.

4. The system of claim 1, wherein said triggering voltage is equal to said local ground of said D/C output.

5. The system of claim 1, wherein said ROF pin is linked to a mechanical safety switch, said switch controlled by a user and capable of preventing said triggering voltage from being applied to said ROF socket even when said ROF socket is mated with said ROF pin.

6. The system of claim 1, wherein each of said plurality of connectors of said output plug are female sockets, and each of said plurality of connectors of said mating socket are male pins.

7. The system of claim 1, wherein said switch is a transistor.

8. The system of claim 1, wherein said first coupler is an optical isolator.

9. The system of claim 1, wherein said second coupler is an optical isolator.

10. The system of claim 1, wherein said first coupler is a transformer.

11. The system of claim 1, wherein said second coupler is a transformer.

12. A safe external A/C adapter for delivering high-voltage to an electrical appliance, said adapter comprising:

an A/C input;

power-supply circuitry for converting said A/C input into a D/C output of absolute voltage relative to a local ground of more than 60 Volts;

a D/C output cord in the form of an insulated cable terminated by an output plug having a plurality of connectors, wherein at least one of said plurality of connectors is linked to said local ground, for delivering said D/C output from said adapter to an electrical appliance;

a controlling circuit coupled to said D/C output through a first coupler, said circuit capable of regulating said D/C output by controlling said A/C input;

a safety switch linked to said D/C output, said switch capable of turning said D/C output on and off;

a Remote ON/OFF (ROF) socket disposed within said output plug;

an actuator circuit linked to said ROF socket and said safety switch, said actuator circuit capable of turning said safety switch ON when a triggering voltage of less than 60V relative to said local ground is applied to said ROF socket, and turning said safety switch OFF when a voltage other than said triggering voltage is applied to said ROF socket; and a secondary shutdown circuit, linked to said ROF socket and said D/C output and coupled to said controlling circuit through a second coupler, and capable of latching off said A/C input in the event that said triggering voltage is not applied to said ROF socket but said safety switch is nevertheless ON (for example, if said safety switch is shorted).

13. The adapter of claim 12, wherein said triggering voltage is equal to said local ground of said D/C output.

14. The adapter of claim 12, wherein said plurality of connectors of said output plug are female sockets.

15. The adapter of claim 12, wherein said switch is a transistor.

16. The adapter of claim 12, wherein said first coupler is an optical isolator.

17. The adapter of claim 12, wherein said second coupler is an optical isolator.

18. The adapter of claim 12, wherein said first coupler is a transformer.

19. The adapter of claim 12, wherein said second coupler is a transformer.

20. A mating socket for use with the adapter of claim 1, said mating socket comprising:

a plurality of connectors, each said connector complementary to, and capable of mating with, a respective one of said plurality of connectors of said output plug; and an ROF pin, capable of mating with said ROF socket, and shorting said ROF socket to a source of voltage equal to said triggering voltage when said output plug is seated within said mating socket.

21. The mating socket of claim 20, wherein said ROF pin is recessed in relation to the other connectors in said mating socket, ensuring that when said output plug is inserted into said mating socket, said ROF pin is the last of said plurality of connectors in said mating socket to mate, and conversely, when said output plug is removed, said ROF pin is the first of said plurality of connectors in said mating socket to become disconnected.

22. The mating socket of claim 20, wherein said source of voltage equal to said triggering voltage is one of said plurality of connectors of said D/C output cord.

23. The mating socket of claim 20, wherein said plurality of connectors are male pins.

24. A system for providing voltage from an external A/C adapter to an electrical appliance, comprising:

an external A/C adapter including:

an A/C input;

circuitry for converting said A/C input into a D/C output;

a D/C output cord terminated by an output plug having a plurality of connectors, wherein at least one of said plurality of connectors is linked to a local ground, for delivering said D/C output from said adapter to an electrical appliance;

a switch linked to said D/C output, said switch capable of turning said D/C output on and off; and an actuator circuit to said switch and controlling said switch according to a triggering voltage applied to at least one of said plurality of connectors of said output plug when said output plug is mated with said electrical appliance; and an electrical appliance including;

a mating socket having a plurality of connectors each said connector complementary to, and capable of mating with, a respective one of said plurality of connectors of said output plug.

25. The system of claim 24, further comprising:

a controlling circuit coupled to said D/C output, said controlling circuit capable of regulating said D/C output by controlling said A/C input, and a secondary shutdown circuit, linked to said output plug and capable of latching off said A/C input if said switch fails.

26. The adapter of claim 25 wherein said actuator circuit is capable of turning said switch ON when a triggering voltage of less than a predetermined level is applied to said output plug, and turning said switch OFF when a voltage at or higher than said predetermined level is applied to said output plug.

27. An external A/C adapter for delivering voltage to an electrical appliance, said adapter comprising:

A/C input;

circuitry for converting said A/C input into a D/C output;

a D/C output cord terminated by an output plug having a plurality of connectors, wherein at least one of said plurality of connectors is linked to a local ground, for delivering said D/C output from said adapter to an electrical appliance;

a switch linked to said D/C output, said switch capable of tuning said D/C output on and off; and an actuator circuit linked to said switch and controlling said switch according to a triggering voltage applied to at least one of said plurality of connectors of said output plug when said output plug is mated with said electrical appliance.

28. The adapter of claim 27, further comprising:

a controlling circuit coupled to said D/C output, said controlling circuit capable of regulating said D/C output by controlling said A/C input; and a secondary shutdown circuit, linked to said output plug and capable of latching off said A/C input if said switch fails.

29. The adapter of claim 28 wherein said actuator circuit is capable of turning said switch ON when a triggering voltage of less than a predetermined level is applied to said output plug, and turning said switch OFF when a voltage at or higher than said predetermined level is applied to said output plug.

* * * * *

UNITED STATES PATENT AND TRADEMARK OFFICE

CERTIFICATE OF CORRECTION

PATENT NO. : 5,952,741

DATED : September 14, 1999

INVENTOR(S) : Samson Toy

It is certified that error appears in the above-identified patent and that said Letters Patent is hereby corrected as shown below:

On the title page, item [22]:

The filing date, please replace "July 16, 1998" with --July 15, 1998--.

On Column 9, line 23, please replace "circuit" with --circuit linked--.

On Column 9, line 28, please replace "including;" with --including:--.

On Column 9, line 36, please replace "input," with --input;--.

On Column 10, line 9, please replace "A/C" with --an A/C--.

Signed and Sealed this

Twenty-seventh Day of March, 2001

*Attest:*

Nicholas P. Godici

NICHOLAS P. GODICI

*Attesting Officer*

*Acting Director of the United States Patent and Trademark Office*